United States Patent
Kim

(10) Patent No.: US 9,312,467 B2
(45) Date of Patent: Apr. 12, 2016

(54) APPARATUS AND METHOD FOR GENERATING SINUSOIDAL WAVES, AND SYSTEM FOR DRIVING PIEZO ACTUATOR USING THE SAME

(71) Applicant: SAMSUNG ELECTRO-MECHANICS CO., LTD., Suwon-Si, Gyeonggi-Do (KR)

(72) Inventor: Gyu Won Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 231 days.

(21) Appl. No.: 14/199,727

(22) Filed: Mar. 6, 2014

(65) Prior Publication Data

US 2015/0168989 A1 Jun. 18, 2015

(30) Foreign Application Priority Data

Dec. 17, 2013 (KR) .......................... 10-2013-0157396

(51) Int. Cl.
| | |
|---|---|
| *H01L 41/04* | (2006.01) |
| *H03M 1/12* | (2006.01) |
| *H03M 1/66* | (2006.01) |
| *G06F 1/03* | (2006.01) |
| *H02N 2/14* | (2006.01) |

(52) U.S. Cl.
CPC ............ *H01L 41/042* (2013.01); *G06F 1/0321* (2013.01); *H03M 1/1245* (2013.01); *H03M 1/66* (2013.01); *B06B 2201/55* (2013.01); *H02N 2/14* (2013.01)

(58) Field of Classification Search
CPC .... H02N 2/14; H01L 41/042; B06B 2201/55; B06B 1/0253; F02D 41/2096
USPC ........................................................ 318/116
See application file for complete search history.

(56) References Cited

U.S. PATENT DOCUMENTS

| | | | | |
|---|---|---|---|---|
| 4,905,101 A | * | 2/1990 | Ohta | H04N 5/95 341/110 |
| 6,407,480 B1 | * | 6/2002 | Nakanishi | H05B 41/2822 310/316.01 |
| 7,312,554 B2 | * | 12/2007 | Vogeley | F04B 43/046 310/316.01 |
| 2009/0243431 A1 | * | 10/2009 | Ohsawa | F04B 43/046 310/317 |
| 2015/0162519 A1 | * | 6/2015 | Kim | G06F 1/0321 318/116 |
| 2015/0168990 A1 | * | 6/2015 | Park | H01L 41/042 318/116 |

FOREIGN PATENT DOCUMENTS

| | | |
|---|---|---|
| KR | 2001-0033383 A | 4/2001 |
| KR | 10-2008-0049380 A | 6/2008 |

* cited by examiner

*Primary Examiner* — Kawing Chan
*Assistant Examiner* — Bradley Brown
(74) *Attorney, Agent, or Firm* — NSIP Law

(57) ABSTRACT

An apparatus for generating sinusoidal waves may include: a look-up table storage unit storing a look-up table including a plurality of sampling points determined based on a base frequency and a sampling frequency; a sinusoidal wave generating unit calculating an integer ratio of a target frequency to the base frequency and obtaining sampling points from the look-up table by reflecting the integer ratio so as to generate a sinusoidal wave; and a correction control unit calculating noise information in the generated sinusoidal wave, and controlling the sinusoidal wave generating unit to correct the sampling frequency if the noise information fails to meet a predetermined requirement.

18 Claims, 3 Drawing Sheets

APPARATUS AND METHOD FOR GENERATING SINUSOIDAL WAVES, AND SYSTEM FOR DRIVING PIEZO ACTUATOR USING THE SAME

CROSS-REFERENCE TO RELATED APPLICATION

This application claims the benefit of Korean Patent Application No. 10-2013-0157396, filed on Dec. 17, 2013, with the Korean Intellectual Property Office, the disclosure of which is incorporated herein by reference.

BACKGROUND

The present disclosure relates to an apparatus and a method for generating sinusoidal waves, and a system for driving a piezo actuator using the same.

As the technology underpinning electronic devices advances, various driving apparatuses are being developed therefor, and various waves are being used in such driving apparatuses.

In particular, it is important for haptic technology used in touch-operated devices such as mobile terminals to respond to a user's input with precision.

In such haptic technology, a piezo actuator driven by a sinusoidal wave is commonly used, and accordingly it is necessary to generate the waveform of the sinusoidal wave more precisely in order to drive the piezo actuator precisely.

In the related art, there is a problem that when multiple sinusoidal waves are generated, variations may occur therein. That is, when sinusoidal waves are generated with respect to a constant base frequency, noise may be generated in a particular frequency band due to the generated sinusoidal waves. In particular, if the particular frequency is not an integer multiple of the base frequency, variations may be increased.

Patent Document 1 discloses a circuit for driving a piezoelectric transformer, while Patent Document 2 discloses a piezoelectric generation system and generation method thereof. However, the related art patent documents fail to disclose any feature aimed at overcoming the above-mentioned problem.

SUMMARY

An aspect of the present disclosure may provide an apparatus and a method for generating sinusoidal waves capable of generating sinusoidal waves more precisely by way of varying a sampling frequency if noise above a certain level exists in the generated sinusoidal waves, and a system for driving a piezo actuator using the same.

According to an aspect of the present disclosure, an apparatus for generating sinusoidal waves may include: a look-up table storage unit storing a look-up table including a plurality of sampling points determined based on a base frequency and a sampling frequency; a sinusoidal wave generating unit calculating an integer ratio of a target frequency to the base frequency and obtaining sampling points from the look-up table by reflecting the integer ratio so as to generate a sinusoidal wave; and a correction control unit calculating noise information in the generated sinusoidal wave, and controlling the sinusoidal wave generating unit to correct the sampling frequency if the noise information fails to meet a predetermined requirement.

The look-up table may include 1,024 sampling points of the sampling frequency with respect to the base frequency.

The sinusoidal wave generating unit may obtain every $n^{th}$ sampling point from among the plurality of sampling points if the integer ratio is n, to generate the sinusoidal wave.

The sinusoidal wave generating unit, upon receiving a request for correcting the sampling points from the correction control unit, may regenerate a sinusoidal wave using the corrected sampling frequency.

The sinusoidal wave generating unit may include a digital-to-analog converter that, upon receiving a digital value of the target frequency, outputs analog values corresponding to sampling points corresponding to the target frequency.

The correction control unit may control the sinusoidal wave generating unit to correct the sampling frequency so that the sampling frequency is an integer multiple of the target frequency.

According to another aspect of the present disclosure, a method for generating sinusoidal waves may include: storing a look-up table storing a plurality of sampling points determined based on a base frequency and a sampling frequency; generating a sinusoidal wave by calculating an integer ratio of a target frequency to the base frequency to obtain sampling points from the look-up table by reflecting the integer ratio; and calculating noise information in the generated sinusoidal wave, and correcting the sampling frequency if the noise information fails to meet a predetermined requirement.

The look-up table may include 1,024 sampling points of the sampling frequency with respect to the base frequency.

The generating of the sinusoidal wave may include obtaining every $n^{th}$ sampling point from among the plurality of sampling points if the integer ratio is n, to generate the sinusoidal wave.

The method may further include: if the sampling frequency is corrected, regenerating a sinusoidal wave using the corrected sampling frequency.

The generating of the sinusoidal wave may be performed by a digital-to-analog converter that, upon receiving a digital value of the target frequency, outputs analog values corresponding to sampling points corresponding to the target frequency.

The correcting of the sampling frequency may include correcting the sampling frequency so that the sampling frequency is an integer multiple of the target frequency.

According to another aspect of the present disclosure, a system for driving a piezo actuator may include: a piezo actuator receiving a sinusoidal wave in both terminals thereof; and an apparatus for generating sinusoidal waves, the apparatus generating a sinusoidal wave by adjusting a sampling frequency so that it meets a predetermined noise requirement, to supply the sinusoidal wave to the piezo actuator.

The apparatus for generating sinusoidal waves may include: a look-up table storage unit storing a look-up table including a plurality of sampling points determined based on a base frequency and a sampling frequency; a sinusoidal wave generating unit calculating an integer ratio of a target frequency to the base frequency and obtaining sampling points from the look-up table by reflecting the integer ratio so as to generate a sinusoidal wave; and a correction control unit calculating noise information in the generated sinusoidal wave, and controlling the sinusoidal wave generating unit to correct the sampling frequency if the noise information fails to meet a predetermined requirement.

The look-up table may include 1,024 sampling points of the sampling frequency with respect to the base frequency.

The sinusoidal wave generating unit may obtain every $n^{th}$ sampling point from among the plurality of sampling points if the integer ratio is n, to generate the sinusoidal wave.

The sinusoidal wave generating unit, upon receiving a request for correcting the sampling points from the correction control unit, may regenerate a sinusoidal wave using the corrected sampling frequency.

The sinusoidal wave generating unit may include a digital-to-analog converter that, upon receiving a digital value of the target frequency, outputs analog values corresponding to sampling points corresponding to the target frequency.

The correction control unit may control the sinusoidal wave generating unit to correct the sampling frequency so that the sampling frequency is an integer multiple of the target frequency.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
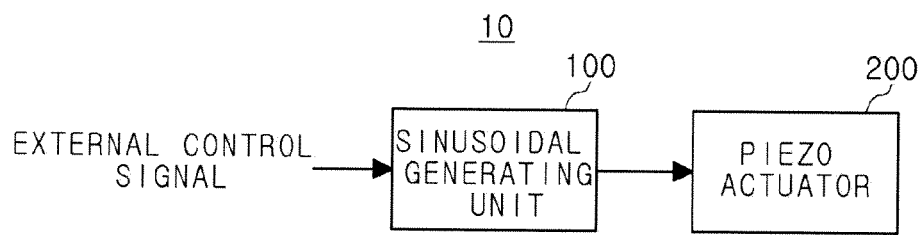
FIG. 1 is a block diagram illustrating a system for driving a piezo actuator according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

FIG. 1 is a block diagram illustrating a system for driving a piezo actuator according to an exemplary embodiment of the present disclosure.

Referring to FIG. 1, the system for driving a piezo actuator 10 may include an apparatus for generating sinusoidal waves 100 and a piezo actuator 200.

The apparatus for generating sinusoidal waves 100 may generate sinusoidal waves to drive the piezo actuator 200 and may provide the sinusoidal waves to the piezo actuator 200. Accordingly, the apparatus for generating sinusoidal waves 100 may serve as an apparatus for driving the piezo actuator 200.

Upon receiving an external control signal (referred hereinafter to as "target frequency") over sinusoidal waves to be generated, the apparatus for generating sinusoidal waves 100 may generate sinusoidal waves at the target frequency.

The apparatus for generating sinusoidal waves 100 may generate sinusoidal waves using a look-up table. The look-up table may include a plurality of sampling points determined based on a base frequency and a predetermined sampling frequency.

For example, if the base frequency is 7.8125 Hz and the predetermined sampling frequency is 8 KHz, there may be 1,024 sampling points. In this case, if the target frequency is 8 KHz, values corresponding to 1,024 sampling points are obtained, and analog values (e.g., a current) corresponding to the values are output, thereby generating a sinusoidal wave. That is, the apparatus for generating sinusoidal waves 100 may obtain the sampling points using a look-up table having digital values stored therein, and then performs digital-analog conversion to thereby generate a sinusoidal wave.

The apparatus for generating sinusoidal waves 100 may check if the generated sinusoidal wave meets a predetermined noise requirement, and, if not, may adjust the sampling frequency so as to regenerate a sinusoidal wave.

The piezo actuator 200 may be operated by receiving the sinusoidal wave from the apparatus for generating sinusoidal waves 100 in both terminals thereof.

Figure 2:
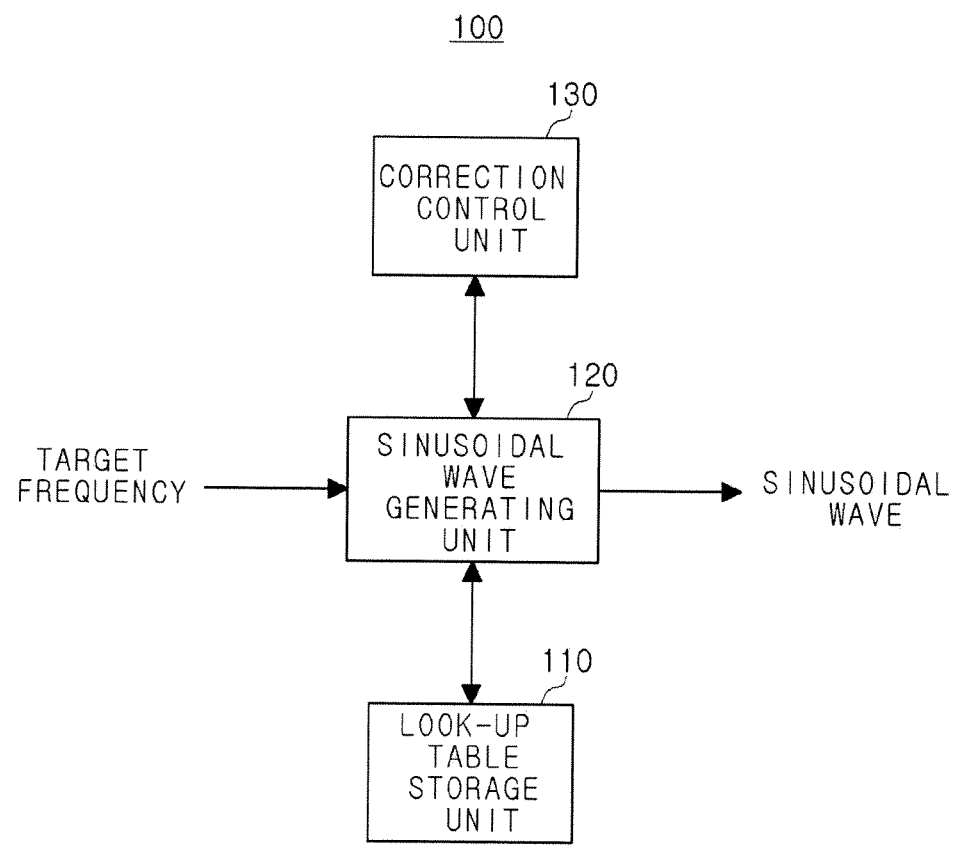
FIG. 2 is a block diagram illustrating an apparatus for generating sinusoidal waves according to an exemplary embodiment of the present disclosure.
Figure 3:
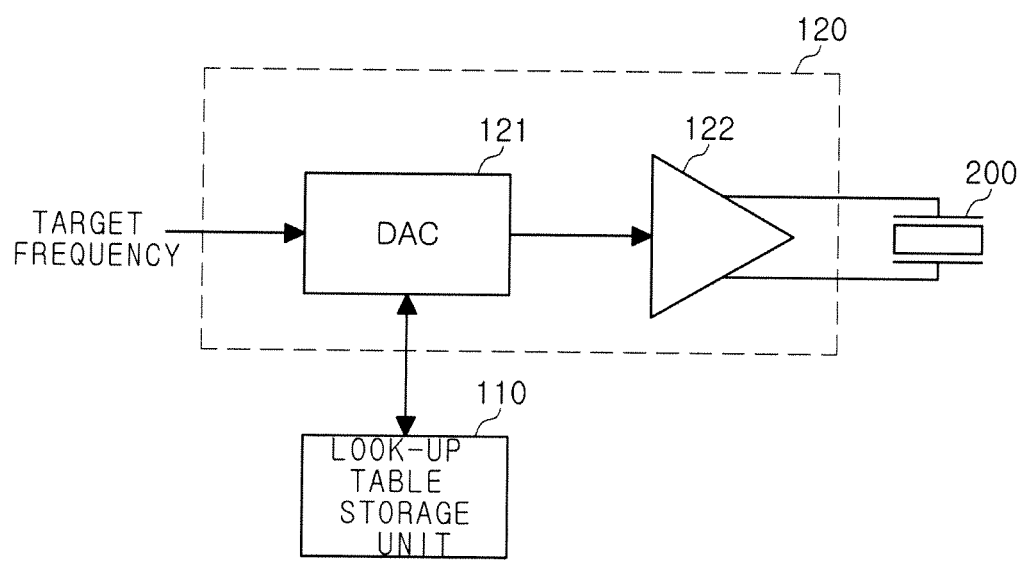
FIG. 3 is a block diagram illustrating an example of the sinusoidal wave generation illustrated in FIG. 2.

FIG. 2 is a block diagram illustrating an apparatus for generating sinusoidal waves according to an exemplary embodiment of the present disclosure, and FIG. 3 is a block diagram illustrating an example of the sinusoidal wave generation illustrated in FIG. 2.

Hereinafter, apparatuses for generating sinusoidal waves according to various exemplary embodiments of the present disclosure will be described with reference to FIGS. 2 and 3.

Referring to FIG. 2, the apparatus for generating sinusoidal waves 100 may include a look-up table storage unit 110, a sinusoidal wave generation unit 120, and a correction control unit 130.

The look-up table storage unit 110 may store a look-up table that includes a plurality of sampling points determined based on the base frequency and sampling frequency.

In an exemplary embodiment, the look-up table may include 1,024 sampling points of the sampling frequency with respect to the base frequency.

The sinusoidal wave generation unit 120 may calculate an integer ratio of the target frequency to the base frequency and may obtain certain sampling points from the look-up table by reflecting the integer ratio, to generate a sinusoidal wave.

In an exemplary embodiment, if the integer ratio is n, the sinusoidal wave generation unit 120 may obtain every $n^{th}$ sampling point from among the sampling points to generate a sinusoidal wave.

For example, in the case that the base frequency is 7.8125 Hz, the predetermined sampling frequency is 8 KHz, the target frequency is 23.4 KHz, and there are 1,024 sampling points. Since the ratio of the target frequency to the base frequency is 3:1, the integer ratio is 3. Accordingly, the sinusoidal wave generation unit 120 may obtain every third sampling point, e.g., 1st, 4th, 7th sampling points, and so on, from among the 1,024 sampling points. Then, the sinusoidal wave generation unit 120 may output an analog value (e.g., a current) corresponding to the obtained sampling points, to generate a sinusoidal wave.

In an exemplary embodiment, upon receiving a request for correcting the sampling points from the correction control unit 130, the sinusoidal wave generation unit 120 may correct the frequency of the sampling points to regenerate a sinusoidal wave.

The correction control unit 130 may calculate noise information in the sinusoidal wave generated in the sinusoidal wave generation unit 120 and may control the sinusoidal wave generation unit 120 to correct the sampling frequency if the noise information does not meet a predetermined requirement. In an exemplary embodiment, the correction control unit 130 may control the sinusoidal wave generation unit 120 so that the ratio of the sampling frequency to the target frequency is an integer.

The noise information may be a signal-to-noise ratio (SNR).

Referring to FIG. 3, the sinusoidal wave generation unit 120 may include a digital-analog converter (DAC) 121 and an amplifier 122.

Upon receiving a digital value of the target frequency, the DAC 121 may output analog values corresponding to the sampling points corresponding to the target frequency.

The amplifier 122 may filter an analog value output from the DAC 121 to generate a sinusoidal wave.

The foregoing descriptions may be summarized with mathematical expressions blow.

Mathematical Expression 1 expresses that a frequency is an integer multiple of the base frequency. The term "base frequency" denotes the base frequency, and the term number_of_cnt denotes a constant number.

Mathematical Expression 2 defines sampling frequency, Fs.

Using the calculated frequency and the sampling frequency, the coefficient of sampling points may be calculated, as expressed in Mathematical Expression 3.

Mathematical Expression 3 may be calculated in two ways.

One method of calculation is to add 0.5 to the divided value then to round the resulting number off. The other method of calculation is to round down below the decimal point of the divided value.

Those two values may be used as the nearest value to a frequency measured using Mathematical Expression 11, i.e., a frequency that is integer multiplied.

Mathematical Expression 4 defines a sampling period, and Mathematical Expression 5 expresses a sinusoidal wave period.

In Mathematical Expression 5, "NofT" denotes an integer number that the period of a sinusoidal wave is repeated.

"L," thus calculated, is overall sampling points.

Further, "t" is a time vector translated from sampling points.

After calculating values using the above six mathematical expressions, by using Mathematical Expression 7, a sinusoidal wave can be generated that has an 8-bit digital value with the corresponding frequency and sampling points.

The value thus calculated is transformed into frequency domain using a Fast Fourier Transform, and by using the value, SNR is calculated using Mathematical Expressions 8, 9 and 10.

$$Freq = base\ frequency \times number\_of\_cnt \quad [Mathematical\ Expression\ 1]$$

$$Fs = Sampling\ frequency \quad [Mathematical\ Expression\ 2]$$

$$num\_L = (Fs/Freq) \quad [Mathematical\ Expression\ 3]$$

$$Ts = 1/Fs \rightarrow Sample\ time \quad [Mathematical\ Expression\ 4]$$

$$L = num\_L * NofT; \rightarrow Length\ of\ signal \quad [Mathematical\ Expression\ 5]$$

$$t = (0:L-1)*Ts \rightarrow Time\ Vector \quad [Mathematical\ Expression\ 6]$$

$$BYTE(((\sin(2*pi*Freq*t)+1)*Digitize+0.5).*amplitude); \quad [Mathematical\ Expression\ 7]$$

$$noise\_power = sum(snr\_data(1,:)) - max(snr\_data); \quad [Mathematical\ Expression\ 8]$$

$$k = max(snr\_data)/noise\_power; \quad [Mathematical\ Expression\ 9]$$

$$dB = 10*\log 10(k); \quad [Mathematical\ Expression\ 10]$$

$$estimate\_val = Fs/num\_L \quad [Mathematical\ Expression\ 11]$$

Figure 4:
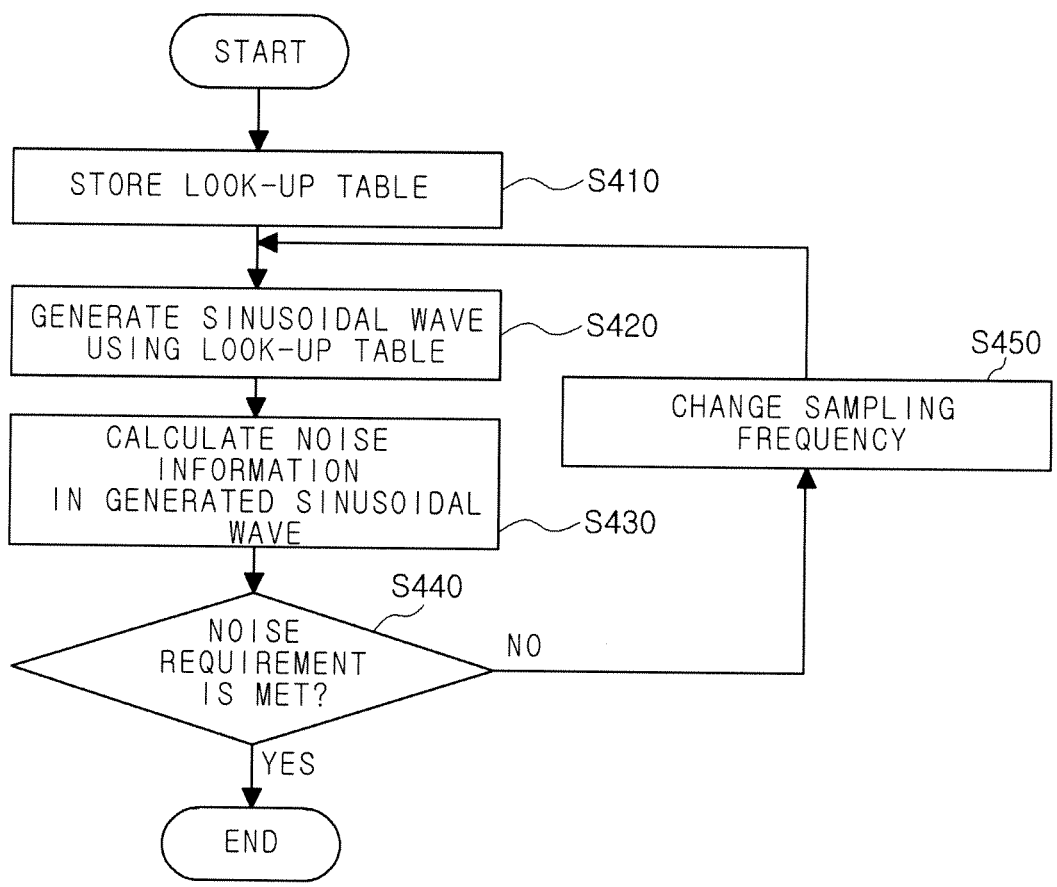
FIG. 4 is a flowchart illustrating a method of generating a sinusoidal wave according to an exemplary embodiment of the present disclosure.

FIG. 4 is a flowchart illustrating a method of generating sinusoidal waves according to an exemplary embodiment of the present disclosure.

The method of generating a sinusoidal wave according to the exemplary embodiment is performed by the apparatus for generating sinusoidal waves 100 described above with reference to FIGS. 1 through 3, and thus redundant descriptions will not be made.

Referring to FIG. 4, the apparatus for generating sinusoidal waves 100 may store a look-up table that includes a plurality of sampling points determined based on the base frequency and sampling frequency (S410).

Then, the apparatus for generating sinusoidal waves 100 may calculate an integer ratio of the target frequency to the base frequency and may obtain sampling points from the look-up table by reflecting the integer ratio, to generate a sinusoidal wave (S420).

The apparatus for generating sinusoidal waves 100 may calculate noise information in the generated sinusoidal wave (S430) and may correct the sampling frequency (S450) if the noise information fails to meet a predetermined requirement (NO in S440).

In an exemplary embodiment, the look-up table may include 1,024 sampling points of the sampling frequency with respect to the base frequency.

In an example of operation S420, if the integer ratio is n, the apparatus for generating sinusoidal waves 100 may obtain every $n^{th}$ sampling point from among the sampling points to generate a sinusoidal wave.

In an exemplary embodiment, when the sampling frequency is corrected, the apparatus for generating sinusoidal waves 100 may regenerate a sinusoidal wave using the corrected sampling frequency.

In an example of operation S420, upon receiving a digital value of the target frequency, the apparatus for generating sinusoidal waves 100 may use a DAC that outputs analog values corresponding to the sampling points corresponding to the target frequency.

In an example of operation S450, the apparatus for generating sinusoidal waves 100 may correct the sampling frequency so that the ratio of the sampling frequency to the target frequency is an integer.

As set forth above, according to exemplary embodiments of the present disclosure, sinusoidal waves can be generated more precisely by way of varying a sampling frequency if noise above a certain level exists in the generated sinusoidal waves.

While exemplary embodiments have been illustrated and described above, it will be apparent to those skilled in the art that modifications and variations could be made without departing from the spirit and scope of the present disclosure as defined by the appended claims.

What is claimed is:

1. An apparatus for generating sinusoidal waves, comprising:
   a look-up table storage unit storing a look-up table including a plurality of sampling points determined based on a base frequency and a sampling frequency;
   a sinusoidal wave generating unit calculating an integer ratio of a target frequency to the base frequency and obtaining sampling points from the look-up table by reflecting the integer ratio so as to generate a sinusoidal wave; and
   a correction control unit calculating noise information in the generated sinusoidal wave, and controlling the sinusoidal wave generating unit to correct the sampling frequency if the noise information fails to meet a predetermined requirement.

2. The apparatus of claim 1, wherein the look-up table includes 1,024 sampling points determined based on the base frequency and the sampling frequency.

3. The apparatus of claim 1, wherein the sinusoidal wave generating unit obtains every nth sampling point from among the plurality of sampling points if the integer ratio is n, to generate the sinusoidal wave.

4. The apparatus of claim 1, wherein the sinusoidal wave generating unit, upon receiving a request for correcting the sampling points from the correction control unit, regenerates a sinusoidal wave using the corrected sampling frequency.

5. The apparatus of claim 1, wherein the sinusoidal wave generating unit includes a digital-to-analog converter that, upon receiving a digital value of the target frequency, outputs analog values corresponding to sampling points corresponding to the target frequency.

6. The apparatus of claim 1, wherein the correction control unit controls the sinusoidal wave generating unit to correct the sampling frequency to be an integer multiple of the target frequency.

7. A method for generating sinusoidal waves, comprising:
   storing a look-up table storing a plurality of sampling points determined based on a base frequency and a sampling frequency;
   generating a sinusoidal wave by calculating an integer ratio of a target frequency to the base frequency to obtain sampling points from the look-up table by reflecting the integer ratio; and
   calculating noise information in the generated sinusoidal wave, and correcting the sampling frequency if the noise information fails to meet a predetermined requirement.

8. The method of claim 7, wherein the look-up table includes 1,024 sampling points determined based on the base frequency and the sampling frequency.

9. The method of claim 7, wherein the generating of the sinusoidal wave includes obtaining every nth sampling point from among the plurality of sampling points if the integer ratio is n, to generate the sinusoidal wave.

10. The method of claim 7, further comprising:
    if the sampling frequency is corrected, regenerating a sinusoidal wave using the corrected sampling frequency.

11. The method of claim 7, wherein the generating of the sinusoidal wave is performed by a digital-to-analog converter that, upon receiving a digital value of the target frequency, outputs analog values corresponding to sampling points corresponding to the target frequency.

12. The method of claim 7, wherein the correcting of the sampling frequency includes correcting the sampling frequency so that the sampling frequency is an integer multiple of the target frequency.

13. A system for driving a piezo actuator, comprising:
    a piezo actuator operated by receiving a sinusoidal wave in both terminals thereof; and
    an apparatus for generating sinusoidal waves, the apparatus generating a sinusoidal wave by adjusting a sampling frequency so that it meets a predetermined noise requirement, to supply the sinusoidal wave to the piezo actuator,
    wherein the apparatus for generating sinusoidal waves comprises
    a look-up table storage unit storing a look-up table including a plurality of sampling points determined based on a base frequency and a sampling frequency;
    a sinusoidal wave generating unit calculating an integer ratio of a target frequency to the base frequency and obtaining sampling points from the look-up table by reflecting the integer ratio so as to generate a sinusoidal wave; and
    a correction control unit calculating noise information in the generated sinusoidal wave, and controlling the sinusoidal wave generating unit to correct the sampling frequency if the noise information fails to meet a predetermined requirement.

14. The system of claim 13, wherein the look-up table includes 1,024 sampling points determined based on the base frequency and the sampling frequency.

15. The system of claim 13, wherein the sinusoidal wave generating unit obtains every nth sampling point from among the plurality of sampling points if the integer ratio is n, to generate the sinusoidal wave.

16. The system of claim 13, wherein the sinusoidal wave generating unit, upon receiving a request for correcting the sampling points from the correction control unit, regenerates a sinusoidal wave using the corrected sampling frequency.

17. The system of claim 13, wherein the sinusoidal wave generating unit includes a digital-to-analog converter that, upon receiving a digital value of the target frequency, outputs analog values corresponding to sampling points corresponding to the target frequency.

18. The system of claim 13, wherein the correction control unit controls the sinusoidal wave generating unit to correct the sampling frequency to be an integer multiple of the target frequency.

* * * * *